(12) United States Patent
Giunchi et al.

(10) Patent No.: US 7,396,506 B2
(45) Date of Patent: *Jul. 8, 2008

(54) METHOD FOR THE PREPARATION OF HIGHLY DENSIFIED SUPERCONDUCTOR MASSIVE BODIES OF MGB$_2$, RELEVANT SOLID END-PRODUCTS AND THEIR USE

(75) Inventors: Giovanni Giunchi, Milan (IT); Sergio Ceresara, Lucca (IT)

(73) Assignee: Edison, S.p.A, Milan (IT)

( * ) Notice: Subject to any disclaimer, the term of this patent is extended or adjusted under 35 U.S.C. 154(b) by 272 days.

This patent is subject to a terminal disclaimer.

(21) Appl. No.: 10/474,918

(22) PCT Filed: May 10, 2002

(86) PCT No.: PCT/IB02/01594

§ 371 (c)(1),
(2), (4) Date: Oct. 16, 2003

(87) PCT Pub. No.: WO02/093659

PCT Pub. Date: Nov. 21, 2002

(65) Prior Publication Data

US 2004/0124086 A1 Jul. 1, 2004

(30) Foreign Application Priority Data

May 11, 2001 (IT) .......................... MI2001A0978

(51) Int. Cl.
*C22C 32/00* (2006.01)
(52) U.S. Cl. ...................................................... 419/12
(58) Field of Classification Search ................... 205/51; 410/10

See application file for complete search history.

(56) References Cited

U.S. PATENT DOCUMENTS

| | | | | |
|---|---|---|---|---|
| 4,718,941 A | * | 1/1988 | Halverson et al. | 75/236 |
| 4,751,048 A | * | 6/1988 | Christodoulou et al. | 420/129 |
| 4,777,014 A | * | 10/1988 | Newkirk et al. | 419/12 |
| 5,366,686 A | * | 11/1994 | Mortensen et al. | 419/5 |
| 5,372,178 A | * | 12/1994 | Claar et al. | 164/98 |
| 5,819,839 A | * | 10/1998 | Mihelich et al. | 164/312 |
| 6,630,427 B2 | * | 10/2003 | Dunand | 505/452 |

(Continued)

OTHER PUBLICATIONS

ASM Handbook, vol. 15, Casting, ASM International, 1988, p. 800.*

(Continued)

*Primary Examiner*—Roy King
*Assistant Examiner*—Tima M McGuthry-Banks
(74) *Attorney, Agent, or Firm*—James V. Costigan; Hedman & Costigan, P.C.

(57) ABSTRACT

A method is described for the preparation of superconductor massive bodies of MgB$_2$, having a density close to the theorical value, which comprises the following passages: mechanical activation of crystalline boron with the formation of activated powders; formation of a porous preform of said powders; assembly of the porous boron preform and massive precursors of metallic magnesium in a container and sealing thereof in an atmosphere of inert gas or with a low oxygen content; thermal treatment of the boron and magnesium as assembled above, at a temperature higher than 700° C. for a time greater than 30 minutes, with the consequent percolation of the magnesium, in liquid phase, through the activated crystalline boron powders.

23 Claims, 5 Drawing Sheets

— X-ray diffraction diagram of the product of Example 2

2 Theta

U.S. PATENT DOCUMENTS

| | | | |
|---|---|---|---|
| 6,769,473 B1 * | 8/2004 | Adachi et al. | 164/71.1 |
| 6,957,480 B2 * | 10/2005 | Giunchi et al. | 29/599 |
| 6,995,119 B2 * | 2/2006 | Dunand | 505/124 |
| 2005/0159318 A1 * | 7/2005 | Giunchi et al. | 505/100 |

OTHER PUBLICATIONS

Chen Y X et al, "Electron Microscopy studies of Interfacial reaction in a (SiCw+B4CP)/ZK60A hybrid composite" Scripta Materialia 07, vol. 43, No. 4 Jul. 28, 2000 p. 337-341, XP004326139 ISSN: 1359-6462.

Cunningham C E et al, "Synthesis and processing of MbG2 powers and wire" Physica C. vol. 353, No. vol. 1-2 May 1, 2001 pp. 37-341, XP004240410 ISSN: 0921-4534.

Giunchi G. "High density MgB2 Obtained by reactive liquid Mg Infiltration" 11. Congresso Nazionale Di Superconduttivita, Satt11, Vietri Sul Mare, Italy Online! Mar. 19-22, 2002, XP00228737.

Dunand DC: "Synthesis of Superconducting Mg/MgB2 composties" Applied Physics Letters, vol. 79 No. 25, Dec. 17, 2001 pp. 4186-4188 P001091950 ISSN: 0003-6951.

* cited by examiner

X-ray diffraction diagram of Boron powders: a) – activated; b) – non-activated

— Container and protective sheaths used in Example 2

1 = Container

2 = Protective sheaths

- X-ray diffraction diagram of the product of Example 2

- AC susceptibility of the product of Example 2

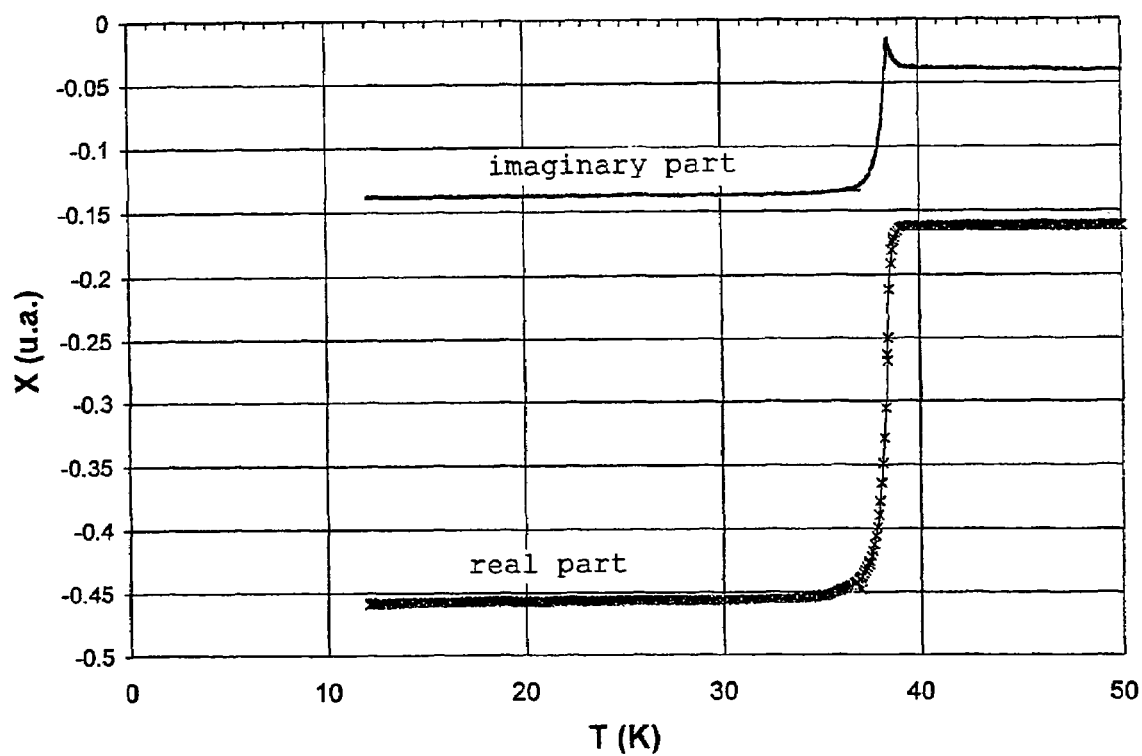

METHOD FOR THE PREPARATION OF HIGHLY DENSIFIED SUPERCONDUCTOR MASSIVE BODIES OF MGB$_2$, RELEVANT SOLID END-PRODUCTS AND THEIR USE

CROSS-REFERENCE TO RELATED APPLICATIONS

Not Applicable

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISK

Not Applicable

REFERENCE TO A MICROFICHE APPENDIX

Not Applicable

BACKGROUND OF THE INVENTION

1) Field of the Invention

The present invention relates to a method for the preparation of highly densified superconductor massive bodies of Mgb$_2$, the revant solid end products and their use.

2) Description of Related Art

It has recently been discovered that magnesium boride has superconductor properties up to 39 K and can therefore be applied in closed circuit cryogenic systems (cryo-refrigerators), which are less costly than those based on the use of liquid helium (Nagamatsu et al., Nature, 410, 63; 2001).

Like all borides, magnesium boride, a compound which has been known for about half a century, is characterized by extreme hardness when it is highly densified.

The densification of magnesium boride however into end-products, reaching values close to 100% of its theoretical density (2.63 g/cm$^3$), effected by the compacting of the powders of the compound itself, normally requires the use of high pressures. Pressures in the order of several GPa are generally used.

Alternative synthesis methods of the compound MgB$_2$ starting from stoichiometric, or non-stoichiometric, mixtures of boron and magnesium, both in powder form and in the form of massive bodies, are also known in literature. In the latter case, however, the use of high pressures is indispensable for obtaining highly densified end-products.

An example is described by Canfield et al., whereby, MgB$_2$ fibres are obtained, starting from boron fibres reacted with liquid Mg or in vapour phase, (Phys. Rev. Lett. 86, 2423 (2001)), having an estimated density of about 80% of the theoretical value.

It is consequently only possible to obtain an end-product of magnesium boride densified up to values close to the theoretical value, and therefore characterized by improved superconductivity and mechanical properties, with the methods of the known art, by the use of high pressures at a high temperature.

The use of high pressures at a high temperature however limits the dimensions of the end-products obtained and necessitates the use of equipment which is not suitable for a mass production.

BRIEF SUMMARY OF THE INVENTION

An objective of the present invention is therefore to obtain superconductor massive bodies of MgB$_2$ with a density close to the theoretical value with a method which overcomes the drawbacks present in the known art.

An object of the present invention relates to a method for the preparation of superconductor massive bodies of MgB$_2$, having a density close to the theoretical value, which comprises the following passages:

a) mechanical activation of crystalline boron with the formation of activated powders;

b) formation of a porous preform of activated powders of crystalline boron;

c) assembly of the porous boron preform and massive precursors of metallic magnesium in a container and sealing thereof in an atmosphere of inert gas or with a low oxygen content;

d) thermal treatment of the boron and magnesium as assembled above, at a temperature higher than 700° C. for a time greater than 30 minutes, with the consequent percolation of the magnesium, in liquid phase, through the activated crystalline boron powders.

A further object of the present invention relates to a superconductor massive body or solid end-product of MgB$_2$, having a density close to the theoretical value, obtained by means of the method of the present invention.

Another object of the present invention also relates to a method which comprises in step c) the use of magnesium mixed with one or more lower-melting metals, such as Ga, Sn, In, Zn, or an Mg-based alloy with said metals.

BRIEF DESCRIPTION OF THE SEVERAL VIEWS OF THE DRAWINGS

FIG. 5 is a graph showing the AC susceptibility of the product of Example 4.

DETAILED DESCRIPTION OF THE INVENTION

Figure 1:
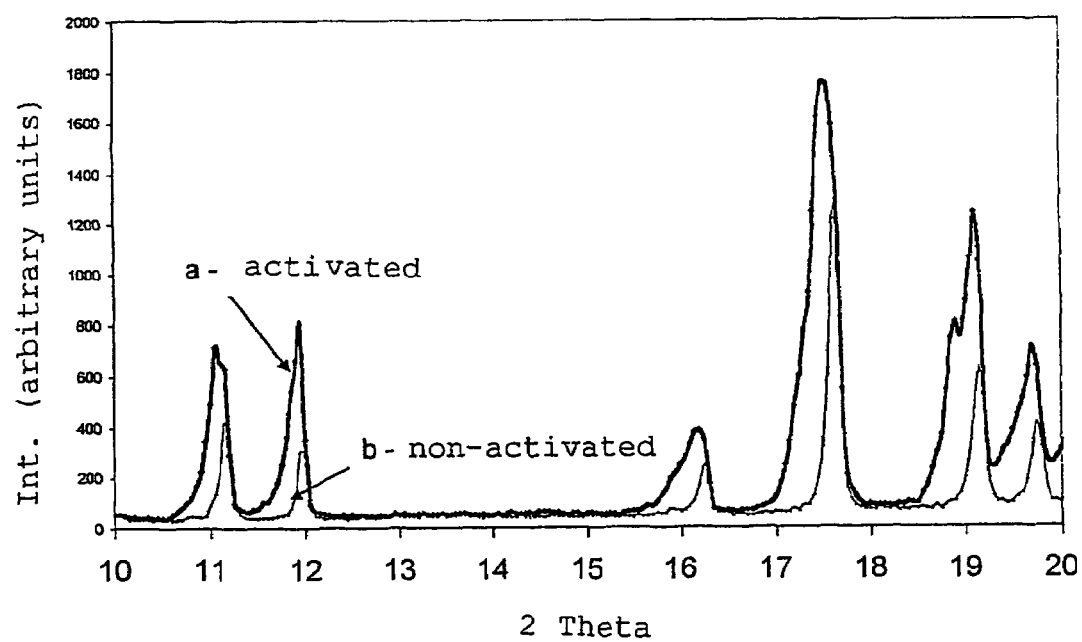
FIG. 1 compares X-ray diffraction diagrams of activated and non-activated boron powders.

The present invention also relates to the use of the massive bodies of MgB$_2$ obtainable with the method according to the present invention for superconductors to be used as electric current cut-ins, variable induction elements in current limitation systems, permanent magnets to be used in levitation systems, in medical magnetic resonance systems, in elementary particle accelerators and detectors, in energy accumulation systems, in linear or non-linear motors, in power generators.

The fundamental advantage of the method according to the present invention lies in the fact that it allows the production, in a simple and economic way, of solid superconductor end-products of MgB$_2$, densified up to values close to the theoretical value, with improved characteristics with respect to the products obtainable with the known methods in the state of the art. From an applicative point of view, the use of MgB$_2$, densified up to values close to the theoretical value, thus obtained, allows the current which can be conveyed to the superconductor products to be increased and also improves the mechanical properties of said end-products.

A further advantage also consists in the fact that highly densified targets of $MgB_2$ allow deposition technologies such as laser ablation or radio-frequency sputtering, to be applied with greater success, to obtain superconductor material deposited on substrates of various origins, in the form of thin films.

In particular, the method for the production of superconductor massive bodies of $MgB_2$, having a density close to the theoretical value, i.e. a density higher than or equal to 2.25 $g/cm^3$, consists in reacting the boron and magnesium elements in a sealed container in an atmosphere of inert gas or with a low oxygen content (lower than 20% atomic), at a high temperature, wherein at least the boron is present in the form of powders, defined as active, with a suitable particle-size and having at least two crystalline phases similar to unit cells of the rhombohedral type.

The mechanical activation step a) crystalline boron flakes having dimensions of a few millimeters and a purity higher than or equal to 99.4%, preferably consists in a repeated crushing by high load compression, under "almost static" conditions, as for example can be effected in a hydraulic press. This activation not only minimizes the powder fraction with a finer particle-size (for example lower than 20 micrometres) which is the typical grinding product of a rotating ball mill, but also allows a powder to be obtained, which maintains the characteristics of the crystallinity type present in the starting flakes, thus making the powders more permeable to liquid magnesium.

In particular, the activated crystalline boron powders are selected so as to have an average volumetric particle diameter ranging from 30 to 70 microns and are practically without oxygen contamination. Step b) comprises the formation of a porous preform of activated crystalline boron powders. The porous preform of activated crystalline boron powders has a shape similar to that of the end-product and must have an apparent density higher than 50% of the theoretical density of the crystalline boron (2.35 $g/cm^3$).

The preform of activated crystalline boron powders may alternatively contain up to 20% atomic of magnesium. In this case, the preform prevalently consists of activated crystalline boron powder and magnesium powder practically without oxygen contamination and a particle-size lower than that of the boron. The preform can also consist of activated crystalline boron powders, surface-covered by metallic Mg and welded to each other by thermal treatment in an inert atmosphere, so as to maintain the porosity of the preform and at the same time provide mechanical consistency for its handling.

Preforms containing magnesium must also satisfy the requisite of apparent density defined above.

The following step c) comprises the assembly of the components which will undergo thermal treatment and transformation to the end-product in step d). The container in which these components are assembled, is also important.

Step c) comprises the insertion in a suitable container of a combination of two components: the first component is the preform produced with the above-mentioned activated crystalline boron powder, having a purity at least higher than or equal to 99.4%, which has a shape similar to that of the end-product and an apparent density higher than 50% of the theoretical density of rhombohedral crystalline boron (2.35 $g/cm^3$), preferably ranging from 51% to 56%. The second component consists of one or more massive bodies of metallic Mg having a purity higher than 99% which in step d), after melting, percolates through the activated crystalline boron powder.

The magnesium in liquid phase preferably derives from the melting of massive precursors of metallic Mg. It is also practically free from oxygen contamination.

The proportions between Mg and B largely depend on the technology selected for carrying out the reaction. In any case they are far from the stoichiometric values of the $MgB_2$ compound. In particular, there is an excess of Mg which is such that the atomic ratio Mg/B is greater than 0.5, preferably said ratio is greater than or equal to 0.55.

When mixtures of Mg with other metals are used, the atomic ratio (metals+Mg)/B should be greater than 0.55, with Mg/B contemporaneously greater than 0.5.

Atomic ratio values Mg/B, or (metals+Mg)/B, lower than the limits defined above, cause a reaction which produces a partial densification of the product, reducing or completely cancelling the superconductivity characteristics relating to the conveying of the electric current.

The container in which step c) is effected, consists of a material which cannot be attacked by boron and magnesium at temperatures up to 1000° C., such as Nb, Ta, MgO, BN, etc. or any material resistant to high temperatures, internally lined by a sheath of one of the above materials in order to prevent contamination of the boron preform and massive bodies of Mg due to the elements forming the container. An example of said container is provided in FIG. 2.

The container must be kept sealed and structurally unaltered during the whole treatment time of step d). An atmosphere of inert gas or, alternatively, an atmosphere with a low oxygen content (less than 20% atomic) must be present inside the container, at a pressure which is such as to ensure the presence of magnesium in liquid phase during the whole treatment of passage d). The sealing and mechanical integrity of the container can be effected by means of welding and/or by fixing in a suitable machine capable of counter-balancing the internal pressure which is generated during the reaction and capable of preventing contamination with atmospheric oxygen.

Step d) of the method comprises thermal treatment at a temperature higher than 700° C. for a time of at least 30 minutes, in the presence of an atmosphere of inert gas, to allow the consequent percolation of the magnesium, prevalently in liquid phase, through the preform of activated crystalline boron powder. Step d) is preferably carried out at temperatures ranging from 800° C. to 1000° C. for 1-3 hours.

The atmosphere inside the container can also be an atmosphere with a low oxygen content (less than 20% atomic) In particular, the percolation can be effected by infiltration of the porous preform of activated boron powder, immersed in molten magnesium, maintained under a pressure of inert gas.

The percolation can also be effected in a sealed container, at a temperature which is sufficiently high and a gas pressure which is such as to allow the liquid magnesium to wet the activated boron powder, constantly in the absence of oxygen or with a minimum oxygen content.

The following detailed description of the method according to the present invention provides that the preform of activated crystalline boron powder, the necessary quantity of metallic Mg, be inserted inside the container—a container which, for the sake of simplicity, can be made of steel suitably protected with the sheath described above, preventing it from being attacked by the magnesium and boron at high temperatures—remaining trapped in an atmosphere of inert gas or with a low oxygen content, at such a pressure as to guarantee the presence of magnesium in liquid phase at the reaction temperatures. The metallic Mg, present in such a quantity as to have an atomic ratio Mg/B greater than 0.5, must be arranged so as to allow, one the high temperatures, i.e. over 650° C., have been reached, the percolation of the liquid magnesium through the boron preform.

The crystalline boron used in the present invention has a prevalent crystallinity of the rhombohedral type characterized by the presence of at least two distinct phases for different unit cell parameters: it must be previously mechanically activated, so as not to modify the crystallinity itself and obtain a particle-size which is such as to be more rapidly and more effectively permeated by the liquid magnesium. One way of activating the boron is by grinding, for example in a press, the crystalline flakes having dimensions of a few millimetres by high load compression crushing under "almost static" conditions, said grinding being different from that effected in a rotating ball mill. This latter type of grinding, in fact, not only produces powders with a much finer particle-size (lower than 20 micrometres), but also induces undesired variations in the crystallinity of the starting crystalline boron, said variations being detected by means of X-ray diffraction from powders, as the disappearance of the splitting of the diffraction lines, leaving the known rhombohedral crystalline boron phase alone (described in database JCPDS, card #11-618): this phenomenon is associated with the disappearance of a larger unit cell phase, present in the starting crystalline B flakes, whose presence can be considered as being favourable for the permeation of the magnesium.

The preform of activated crystalline boron powders can be prepared with the usual powder compacting techniques and must have an appropriate apparent density. The preform can alternatively be produced in the container itself by pouring the activated crystalline boron powder directly inside and compacting it until the desired apparent density is reached.

DESCRIPTION OF THE PREFERRED EMBODIMENTS

As specified above, the preform of activated crystalline boron powder can contain up to 20% atomic of magnesium and can consist of activated crystalline boron powders, surface-coated by metallic Mg.

It has been surprisingly found that the use of preforms suitably prepared as described above, closed inside a sealed container containing appropriate contents of inert gas or with a low oxygen content and maintaining the reagents at temperatures higher than 700° C. for at least 30 minutes, allows the reactive transformation of B and Mg forming $MgB_2$ and minority metallic Mg in the whole volume already occupied by the preform. The products are homogeneously distributed, also inside the end-products, with the occasional presence of empty zones having average dimensions of less than 20 micrometres. Neither the presence of metallic magnesium nor the presence of empty zones has a significant influence on the extraordinary superconductor characteristics of the end-products.

By using as reagent, instead of pure liquid Mg, a mixture of this with one or more lower-melting metals, such as for example Ga, Sn, In and Zn, or an equivalent alloy, the latter present in the desired quantity up to the percentage corresponding to the eutectic point of the alloy, it is equally possible to produce highly densified end-products of $MgB_2$ having analogous superconductor properties to those obtained using pure metallic Mg.

The presence of minority phases, foreign to the crystalline lattice of $MgB_2$ and due to the metals used in the alloy, has proved not to be obstacle for the superconductivity. The use of these alloys, having melting points lower than that of pure magnesium, by reducing the viscosity of the liquid metal at the typical reaction temperatures, allows the reaction to take place in more rapid times and/or at lower temperatures and is therefore a useful method for reducing the process costs.

The main advantage of the method according to the present invention, as previously observed, consists in that it allows the production, in a simple and economic way, of superconductor solid end-products of $MgB_2$, densified up to values close to the theoretical value, with improved characteristics with respect to the products obtained with the known methods in the state of the art. From an applicative point of view, the use of $MgB_2$, densified up to values close to the theoretical value, thus obtained, allows the current which can be conveyed into the superconductor solid end-products, to be increased and also improves their mechanical characteristics.

The following examples are provided for a better understanding of the present invention.

EXAMPLE 1

20 g of activated crystalline boron powder are prepared starting from flakes of crystalline boron having dimensions of a few millimetres (purity 99.4%, of commercial origin: grade K2 of H. C. STARK, Goslar (D)), grinding the flakes by applied high load crushing, i.e. by placing them between two metallic plates situated between the pistons of a press, to which loads of up to 50 tons are repeatedly applied, under "almost static" conditions. The powders thus ground are sieved with a 100 micrometre mesh sieve. The X-ray diffraction spectrum of the powders thus sieved, still has splitting, on the part of the higher interplanar distances, of the diffraction peaks typical of the crystalline boron phase (rhombohedral cell described in the file JCPDS, card#11-618 corresponding to pseudohexagonal cell sides $a_o$=1.095 nm, $c_0$=2.384 nm). The supplementary diffraction peaks, present in the activated powder, have an intensity comparable with those of the rhombohedral phase and can be interpreted as belonging to a phase having a cell similar to a rhombohedral cell, corresponding to pseudohexagonal cell sides $a_o$=1.102 nm, $c_o$=2.400 nm, with a consequent average volume expansion of 1.8%, with respect to the regular rhombohedral crystalline boron phase. As an example, the splitting of the first five reflexes can be observed in the X-ray diffraction diagram of powders represented in FIG. 1 (thick line) which also indicates for comparative purposes (thin line) the corresponding reflexes of a boron powder obtained from the same starting flakes, but ground with a conventional method, i.e. with a rotating ball mill.

EXAMPLE 2

Figure 2:
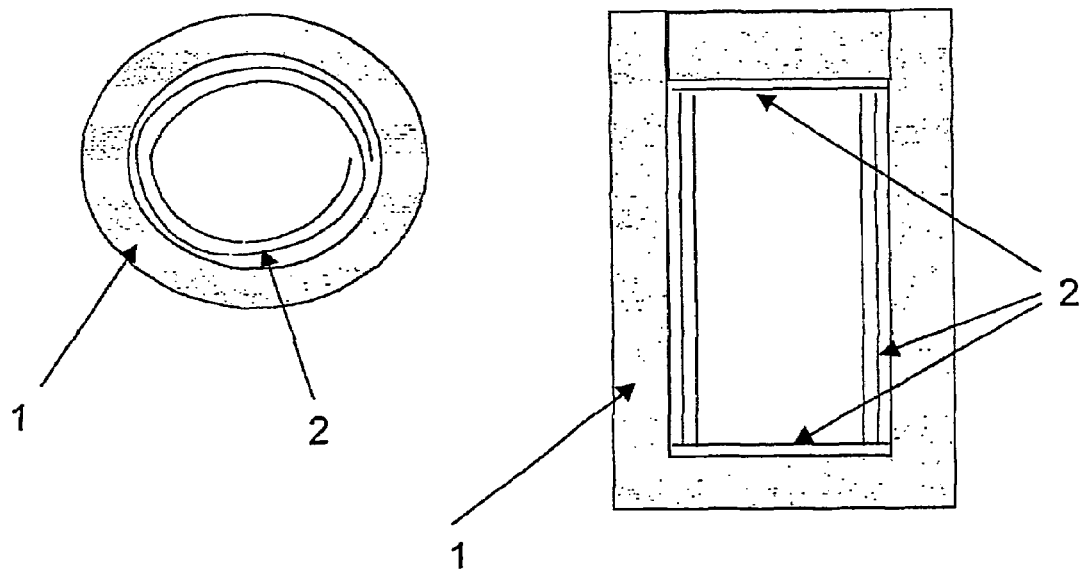
FIG. 2 is a diagram of the container and protective sheaths used in Example 2.

A cylindrical steel container, schematically illustrated in FIG. 2, is lined with a sheet of Nb having a thickness of 100 micrometres (FIG. 2 wherein 1 indicates the steel container and 2 the protective sheaths). The sheet is wrapped twice around the internal wall and two disks of Nb having the same thickness are placed on the bottom and below the plug of the steel cylinder. Two magnesium cylinders, having a total weight of 15.2 g, a purity of 99% and a diameter which is such as to allow them to be accurately inserted inside the Nb sheath, are subsequently inserted into the container thus lined; 10.7 g of the activated crystalline boron powder of Example 1 are placed between the above two Mg cylinders and compacted by gravity, with an apparent density equal to 52% of the theoretical density of rhombohedral crystalline B.

The weights of the reagents are such as to obtain an atomic ratio Mg/B equal to 0.63.

The steel container is placed in a stream of Argon and then sealed by welding the plug to the electrode. It is then placed in a quartztube where it is heated, in a stream of Argon, to a temperature of 950° C., for 3 hours. The gas entrapped in the steel container: generates a pressure of about 4 atmospheres at 950° C., sufficient for ensuring the stability of the liquid Mg phase in equilibrium with $MgB_2$ (see the article of Zi-Kui Liu et al. Preprint in Condensed-Matter Publ. Nr. 0103335, March 2001).

Figure 3:
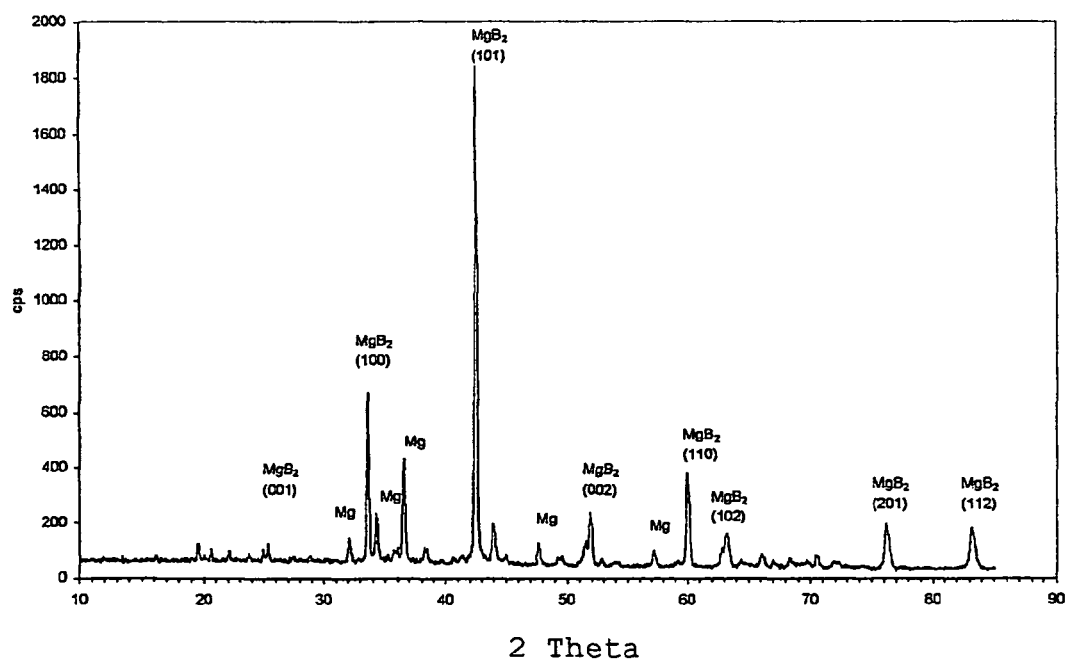
FIG. 3 is an X-ray diffraction pattern of the product of Example 2.

After cooling, the metallic container is opened and a homogeneously densified cylinder, having a density of 2.4 g/cm$^3$, a diameter of about 17 mm and a height of about 30 mm, is removed from the central part. Analysis by means of X-ray diffraction from powders, represented in FIG. 3, verifies that said densified cylinder mainly consists of $MgB_2$, with the presence of a minority phase of metallic Mg and other minority peaks, non-identifiable but in any case not attributable to MgO.

Figure 4:
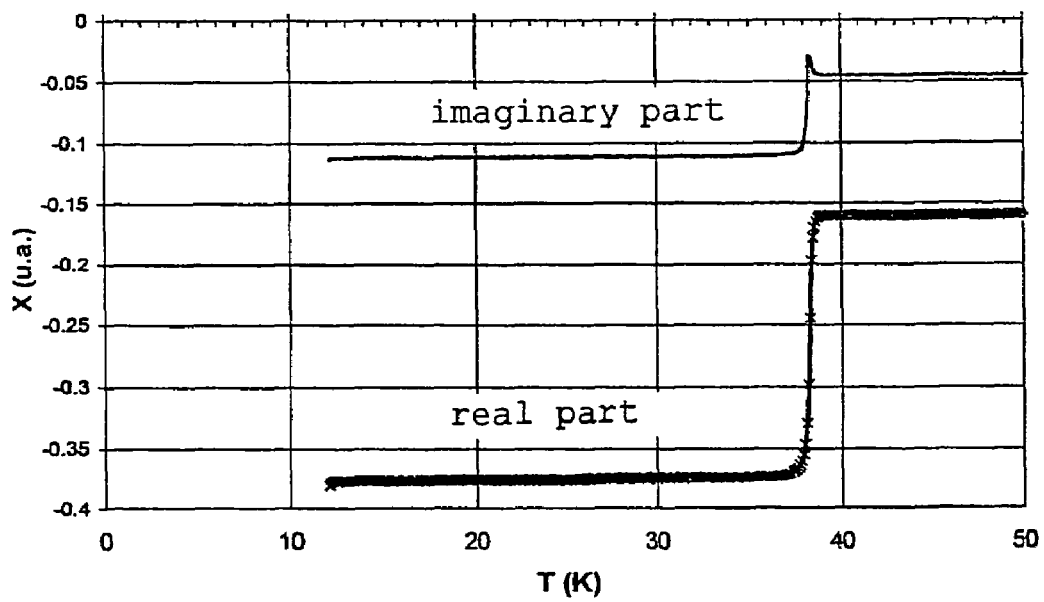
FIG. 4 is a graph showing the AC susceptibility of the product of Example 2.

A part of the $MgB_2$ cylinder thus obtained is then removed to control its critical temperature by measuring the magnetic susceptibility in alternating current, represented in FIG. 4, verifying that the superconductive transition has an incipient Tc of 39 K and the broadening of the curve, in the inflection point, is $\Delta T=0.5$ K.

A rectangular bar with a section equal to 6.2 mm$^2$ and a length equal to 28 mm, is then cut from the $MgB_2$ cylinder, and resistive measurements of the critical current are effected in the presence of high magnetic fields at a temperature of 4.2 K.

With the criterion of the critical current measurement at the electric field corresponding to 100 microvolts/m (European regulation EN61788-1: 1998, the values of Table 1 were obtained:

TABLE 1

| Magnetic field (Tesla) | Critical stream density (A/mm$^2$) |
|---|---|
| 9 | 29.0 |
| 10 | 12.0 |
| 11 | 4.5 |
| 12 | 2.2 |

EXAMPLE 3

Comparative

Following the same procedure described in Example 2, an analogous container is prepared, using the same quantity of Mg and 11.58 g of crystalline boron powder, of the same origin as that of Example 1, but not activated according to the procedure described in Example 1. The atomic ratio between the Mg/B reagents is therefore equal to 0.58. The crystalline boron powder was ground conventionally in a rotating ball mill and sieved with a sieve having a mesh of 100 micrometres. The powder, which is much finer, is compacted to an apparent density value equal to 57% of the theoretical density of rhombohedral crystalline boron.

After thermal treatment analogous to that of Example 2, the resulting product is removed from the container, consisting of two densified cylinders of $MgB_2$, having a diameter of 17 mm and a height of about 8 mm, and partially reacted boron powder, situated between, the two densified cylinders.

EXAMPLE 4

The procedure described in Example 2 is followed, both for the preparation of the container and for the nature and method of use of the activated crystalline boron powder. In addition to two cylinders of metallic Mg, two disks of metallic Zn (purity 99%) are also used, in accordance with the following overall quantities: Mg=5.91 g, Zn=4.64 g, B=5.10 g. The following atomic ratios are therefore used: (Zn+Mg)/B=0.67; Mg/B=0.52; Zn/Mg=0.29.

The activated crystalline boron powder was compacted in the container to an apparent density of 54% of the theoretical value of rhombohedral crystalline boron.

After thermal treatment carried out at 850° C. for 2 hours, a homogeneously densified cylinder is removed from the container, having a diameter of 14 mm and a height of 22 mm and a density=2.57 g/cm$^3$, which, upon X-ray diffraction analysis, proves to mainly consist of $MgB_2$, with minority phases containing Zn.

A part of the cylinder of $MgB_2$ thus obtained is then removed to control its critical temperature by measuring the magnetic susceptibility in alternating current, FIG. 5, verifying that the superconductive transition has an incipient Tc of 38.4 K and the broadening of the curve, in the inflection point, is $\Delta T=1.0$ K.

The invention claimed is:

1. A method for the preparation of superconducting massive bodies of $MgB_2$, having a density close to the theoretical value, which comprises the following steps: a) mechanically activating crystalline boron to form activated powders; b) forming a porous preform of activated crystalline boron powders; c) assembling the porous boron preform and massive precursors of metallic magnesium in a container and sealing said container in an atmosphere of inert gas or an atmosphere with a low oxygen content, wherein said sealed container is capable of counterbalancing the internal pressure in said container which is generated during thermal treatment and is also capable of preventing the contents of said container from contamination with atmospheric oxygen during thermal treatment; d) thermally treating the boron and magnesium as assembled above, at a temperature higher than 700° C. for a time greater than 30 minutes, with the consequent percolation of the magnesium, in liquid phase, through the activated crystalline boron powders.

2. The method according to claim 1, characterized in that the mechanical activation passage a) of crystalline boron consists in grinding flakes of crystalline boron by repeated crushing effected by high load compression.

3. The method according to claim 1, characterized in that the activated crystalline boron powders have an average volumetric particle diameter ranging from 30 to 70 micrometers and have a type of crystallinity equal to that of the starting crystalline boron flakes.

4. The method according to claim 1, characterized in that the preform of activated crystalline boron powders is prepared with the usual powder compacting techniques.

5. The method according to claim 1. characterized in that the preform of activated crystalline boron powders is prepared in the container itself by directly pouring the activated crystalline boron powder inside and compacting it.

6. The method according to claim 1, characterized in that the preform of activated crystalline boron powders has an apparent density higher than 50% of the theoretical density of the crystalline boron (2.35 g/cm.sup.3).

7. The method according to claim 1. characterized in that the preform of activated crystalline boron powders has a purity higher than or equal to 99.4%.

8. The method according to claim 1, characterized in that the preform of activated crystalline boron powders has a shape similar to that of the end-product.

9. The method according to claim 1, characterized in that the preform of activated crystalline boron powders contains up to 20% atomic of magnesium in the form of magnesium powder having a particle-size lower than that of boron.

10. The method according to claim 1, characterized in that the preform of activated crystalline boron powders consists of activated crystalline boron powders, surface coated by metallic magnesium.

11. The method according to claim 1, characterized in that the combining step c) of the porous boron preform and massive precursors of metallic magnesium in a container is effected with massive precursors of metallic magnesium having a purity higher than 99%.

12. The method according to claim 1, characterized in that in step c) there is an excess of Mg which is such that the atomic ratio Mg/B is greater than 0.5.

13. The method according to claim 1, characterized in that the atomic ratio Mg/B is higher than or equal to 0.55.

14. The method according to claim 1, characterized in that the container used in step c) consists of a material which cannot be attacked by the boron and magnesium at temperatures up to 1000° C.

15. The method according to claim 14, characterized in that the material is Nb, Ta, MgO, BN.

16. The method according to claim 1, characterized in that the container used in step c) consists of any material resistant to high temperatures, internally lined by a sheath of a material which cannot be attacked by the boron and magnesium at temperatures up to 1000° C.

17. The method according to claim 1, characterized in that step d) comprises thermal treatment at temperatures ranging from 800° C. to 1000° C., for 1 to 3 hours.

18. The method according to claim 16, where the container material used in step c) is steel.

19. The method according to claim 16, where the internally lined sheath materials are selected from Nb, Ta, and MgO.

20. The method according to claim 1, characterized in that in step c) the massive precursors of metallic Mg consist of massive bodies of magnesium and one or more lower-melting metals or equivalent alloys.

21. The method according to claim 20, characterized in that the lower-melting metals arc present in such a quantity as to reach as far as possible the percentage corresponding to the eutectic point of the equivalent alloy.

22. A method for the preparation of superconducting massive bodies of $MgB_2$, having a density close to the theoretical value, which comprises the following steps: a) mechanically activating of crystalline boron with the formation of activated powders; b) forming a porous preform of activated powders of crystalline boron; c) assembling, the porous boron preform and massive precursors of metallic magnesium consisting of massive bodies of magnesium and one or more lower-melting metals or equivalent alloys that melt at a temperature lower than the melting temperature of magnesium in a container and sealing thereof in an atmosphere of inert gas or with a low oxygen content; d) thermally treating the boron and magnesium as assembled above, at a temperature higher than 700° C. for a time greater than 30 minutes, with the consequent percolation of the magnesium, in liquid phase, through the activated crystalline boron powders the method according to claim 19, characterized in that wherein the atomic ratio of the lower-melting metal+metallic magnesium/boron is greater than 0.55 and contemporaneously the atomic ratio of magnesium/boron is greater than 0.5.

23. The method according to claim 20, characterized in that the lower-melting metals are selected from Ga, Sn, In and Zn.

* * * * *